United States Patent
Koog et al.

(10) Patent No.: US 9,391,032 B2
(45) Date of Patent: Jul. 12, 2016

(54) INTEGRATED CIRCUITS WITH INTERNAL PADS

(71) Applicant: Samsung Electronics Co., Ltd., Suwon-si, Gyeonggi-do (KR)

(72) Inventors: Young Koog, Milpitas, CA (US); Jiankang Wang, Sunnyvale, CA (US); Harpreet Gill, San Jose, CA (US); Sunghwan Min, Sunnyvale, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/267,872

(22) Filed: May 1, 2014

(65) Prior Publication Data
US 2015/0145122 A1    May 28, 2015

Related U.S. Application Data

(60) Provisional application No. 61/910,032, filed on Nov. 27, 2013.

(51) Int. Cl.
| | | |
|---|---|---|
| *H01L 23/00* | (2006.01) | |
| *H01L 23/495* | (2006.01) | |
| *H01L 23/522* | (2006.01) | |

(52) U.S. Cl.
CPC .............. *H01L 24/06* (2013.01); *H01L 23/495* (2013.01); *H01L 23/522* (2013.01); *H01L 2224/06133* (2013.01); *H01L 2224/06135* (2013.01)

(58) Field of Classification Search
CPC .... H01L 23/498; H01L 23/488; H01L 23/485
USPC .............. 257/737, 738, 773; 365/63; 716/122
See application file for complete search history.

(56) References Cited

U.S. PATENT DOCUMENTS

| | | | | |
|---|---|---|---|---|
| 5,208,782 | A * | 5/1993 | Sakuta | G11C 11/406 257/784 |
| 6,069,812 | A * | 5/2000 | Lee | G11C 5/025 365/51 |
| 6,222,213 | B1 | 4/2001 | Fujiwara | |
| 6,362,995 | B1 * | 3/2002 | Moon | G11C 11/4097 365/189.08 |
| 6,469,327 | B1 * | 10/2002 | Yasuda | H01L 23/50 257/207 |
| 6,836,026 | B1 | 12/2004 | Ali et al. | |
| 7,117,469 | B1 | 10/2006 | Dahl | |
| 7,165,232 | B2 | 1/2007 | Chen et al. | |
| 7,434,189 | B2 | 10/2008 | Baumann et al. | |
| 8,013,362 | B2 | 9/2011 | Matsuoka | |
| 8,344,786 | B2 | 1/2013 | Gion | |
| 8,492,795 | B1 | 7/2013 | Chen | |
| 2003/0058729 | A1 * | 3/2003 | Nagata | G11C 5/025 365/230.03 |
| 2003/0156442 | A1 * | 8/2003 | Origasa | G11C 5/06 365/52 |
| 2004/0256741 | A1 * | 12/2004 | Lee | H01L 23/5286 257/782 |
| 2008/0049483 | A1 * | 2/2008 | Horiuchi | G11C 5/14 365/63 |
| 2010/0065954 | A1 * | 3/2010 | Tu | H01L 25/0655 257/686 |
| 2011/0012260 | A1 * | 1/2011 | Tokunaga | G06F 17/5068 257/738 |
| 2011/0193086 | A1 | 8/2011 | Lee et al. | |

(Continued)

*Primary Examiner* — Marc Armand
*Assistant Examiner* — Younes Boulghassoul
(74) *Attorney, Agent, or Firm* — Renaissance IP Law Group LLP

(57) ABSTRACT

An embodiment includes an integrated circuit, comprising: a substrate; a first circuit formed on the substrate and coupled to a plurality of first pads on the substrate; and a second circuit formed on the substrate and coupled to a plurality of second pads on the substrate. The first pads are formed on a perimeter of the substrate; and the second pads extend from the perimeter of the substrate towards an interior of the substrate.

15 Claims, 6 Drawing Sheets

(56) References Cited

U.S. PATENT DOCUMENTS

| | | | |
|---|---|---|---|
| 2011/0260318 A1* | 10/2011 | Eisenstadt | G06F 17/5054 257/737 |
| 2012/0133055 A1* | 5/2012 | Machida | H01L 24/06 257/777 |
| 2012/0241936 A1* | 9/2012 | Kim | H01L 25/0657 257/690 |
| 2012/0272112 A1 | 10/2012 | Oh et al. | |
| 2014/0104935 A1* | 4/2014 | Ware | G11C 7/1012 365/154 |
| 2015/0048521 A1* | 2/2015 | Kwon et al. | 257/777 |

* cited by examiner

INTEGRATED CIRCUITS WITH INTERNAL PADS

BACKGROUND

This disclosure relates to integrated circuits and, in particular, integrated circuits with internal pads.

Integrated circuits have increasing numbers of pads. For example, for 72 bit double data rate (DDR) memory devices, each channel may need over 300 I/O pads. The pads may be placed on a perimeter of a substrate. The number and location of such pads create design challenges related to the physical size, signal integrity, power routing, and package design.

SUMMARY

An embodiment includes an integrated circuit, comprising: a substrate; a first circuit formed on the substrate and coupled to a plurality of first pads on the substrate; and a second circuit formed on the substrate and coupled to a plurality of second pads on the substrate. The first pads are formed on a perimeter of the substrate; and the second pads extend from the perimeter of the substrate towards an interior of the substrate.

Another embodiment includes a system, comprising: an first integrated circuit comprising: a substrate; a first circuit formed on the substrate and coupled to a plurality of first pads on the substrate; and a second circuit formed on the substrate and coupled to a plurality of second pads on the substrate; wherein: the first pads are formed on a perimeter of the substrate; and the second pads extend from the perimeter of the substrate towards an interior of the substrate; and a second integrated circuit coupled to at least part of the first pads and at least part of the second pads.

Another embodiment includes a method, comprising: forming a first circuit and a second circuit on a substrate; forming a plurality of first pads on the substrate, coupled to the first circuit and disposed on a perimeter of the substrate; and forming a plurality of second pads on the substrate, coupled to the second circuit, and extending from the perimeter of the substrate towards an interior of the substrate.

DETAILED DESCRIPTION

Figure 1:
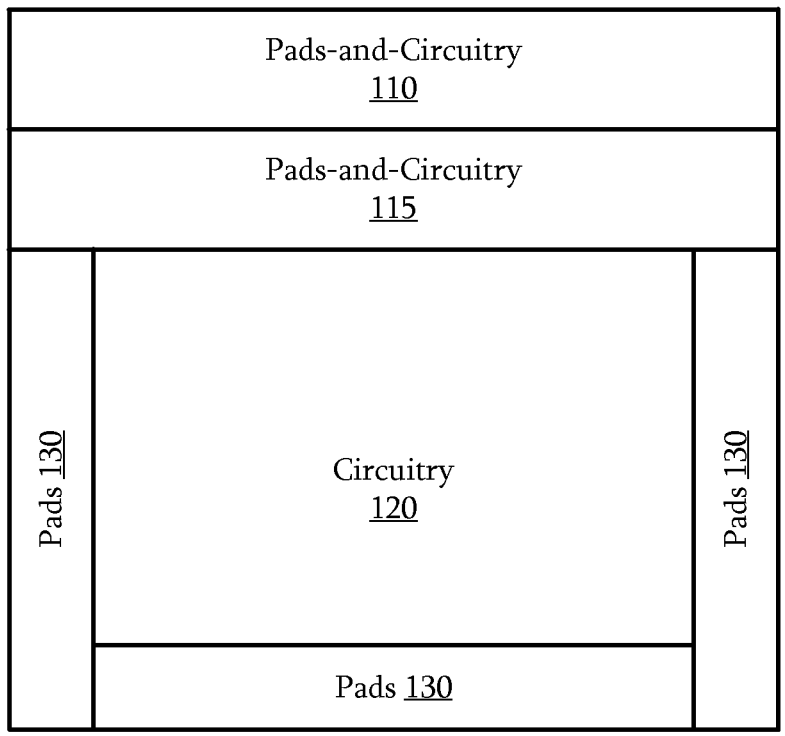
FIG. 1 is a schematic view of an integrated circuit according to an embodiment.

The embodiments relate to integrated circuits with internal pads. The following description is presented to enable one of ordinary skill in the art to make and use the embodiments and is provided in the context of a patent application and its requirements. Various modifications to the exemplary embodiments and the generic principles and features described herein will be readily apparent. The exemplary embodiments are mainly described in terms of particular methods and systems provided in particular implementations.

However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of this disclosure. The exemplary embodiments will also be described in the context of particular methods having certain steps. However, the method and system operate effectively for other methods having different and/or additional steps and steps in different orders that are not inconsistent with the exemplary embodiments. Thus, embodiments are not intended to be limited to the particular embodiments shown, but are to be accorded the widest scope consistent with the principles and features described herein.

The exemplary embodiments are described in the context of particular integrated circuits having certain components. One of ordinary skill in the art will readily recognize that embodiments are consistent with the use of integrates circuits having other and/or additional components and/or other features. One of ordinary skill in the art will also readily recognize that the method and system are described in the context of a structure having a particular relationship to a substrate. However, one of ordinary skill in the art will readily recognize that the method and system are consistent with other structures. The method and system are also described in the context of single elements. However, one of ordinary skill in the art will readily recognize that the method and system are consistent with the use of integrated circuits having multiple elements.

It will be understood by those skilled in the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. Furthermore, in those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

FIG. 1 is a schematic view of an integrated circuit according to an embodiment. In this embodiment, the integrated circuit 100 includes at least two sets of pads-and-circuitry 110 and 115, additional circuitry 120, and additional pads 130 disposed on a substrate. The substrate is not illustrated for clarity as it extends to the perimeter of the illustrated elements.

The pads 130 include pads disposed on a perimeter of the substrate. The pads 130 may be used to interface with at least part of the circuitry 120. The pads of the pads-and-circuitry 110 may also be disposed on the perimeter of the substrate. That is, the pads of the pads-and-circuitry 110 may be disposed similarly to the pads 130.

The pads of the pads-and-circuitry 115 may also include pads disposed on the perimeter of the substrate. However, the pads of the pads-and-circuitry 115 also extend towards an interior of the substrate. As will be described in further detail below, the pads of the pads-and-circuitry 115 may extend from one side of the substrate to the other. In other embodiments, the pads of the pads-and-circuitry 115 may not include pads on the perimeter of the substrate. That is, the pads of the pads-and-circuitry 115 may each be within the interior of the substrate. However, even though the pads of the pads-and-circuitry 115 may not extend to the perimeter, other pads separate from the pads-and-circuitry 115 may be disposed on the perimeter.

Figure 2:
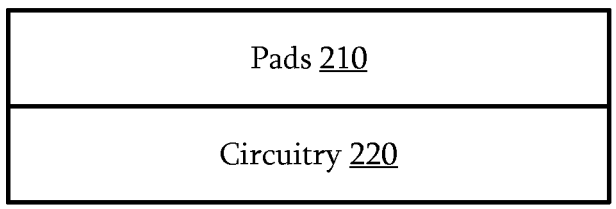
FIG. 2 is a schematic view of a part of an integrated circuit according to an embodiment.

FIG. 2 is a schematic view of a part of an integrated circuit according to an embodiment. In this embodiment, the part 200 of the integrated circuit includes pads 210 and circuitry 220. The part 200 is an example of the pads-and-circuitry 110 or 115 of FIG. 1. If the part 200 is the pads-and-circuitry 110, the pads 210 may be disposed on the perimeter of the substrate. However, if the part 200 is the pads-and-circuitry 115, the pads 210 may extend through an interior of the substrate.

Figure 3:
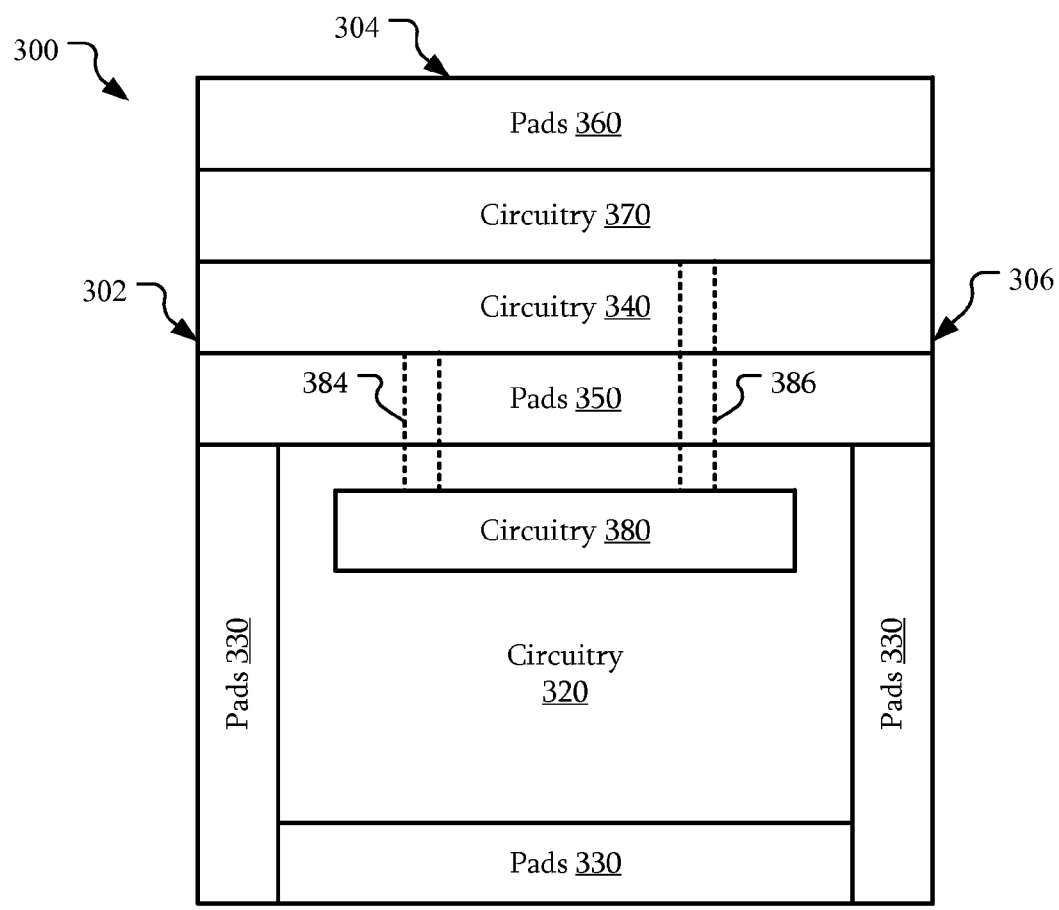
FIG. 3 is a schematic view of an integrated circuit according to another embodiment.

FIG. 3 is a schematic view of an integrated circuit according to another embodiment. In this embodiment, the integrated circuit 300 includes circuitry 320 and pads 330 similar to the circuitry 120 and pads 130 of FIG. 1. The pads 360 and circuitry 370 may form a part similar to part 200 of FIG. 2. Similarly, pads 350 and circuitry 340 may form a part similar to part 200 of FIG. 2 rotated by 180 degrees, mirrored, or the like. In particular, the pads 350 extend from side 302 of the substrate to side 306 of the substrate through an interior of the substrate.

The circuitry 340 and 370 are operationally coupled to circuitry 380 within the circuitry 320. The circuitry 340 is coupled to the circuitry 380 through channel 384. Similarly, the circuitry 370 is coupled to the circuitry 380 through channel 386. In particular, the channels 384 and 386 both extend between individual pads of the pads 350. For example, in a region where the channel 384 extends through the pads 350, the adjacent individual pads of the pads 350 are spaced apart to provide space for the channel 384.

In this embodiment, the circuitry 340 and 370 are disposed between the pads 350 and the pads 360. In a particular embodiment, the pads 360 are configured to be operationally coupled to circuitry 370 and the pads 350 are operationally coupled to the circuitry 340.

In an embodiment, the pads 360 are disposed along a side 304 of the substrate. In particular, the pads 360 may, but need not extend along substantially the entire side 304. That is, the pads 360 may extend from side 302 of the substrate to side 306 of the substrate. Here the sides 302 and 306 are substantially parallel to each other and both are substantially perpendicular to side 304.

The pads 350 also extend from side 302 of the substrate to side 306 of the substrate. In other words, pads 350 and pads 360 may form two substantially parallel sets of pads extending from one side 302 of the substrate to another side 306 with the pads 350 offset from the pads 360 towards an interior of the substrate.

Although circuitry 340 and 370 are illustrated as extending to the sides 302 and 306, in some embodiments, pads may be placed in the regions labeled circuitry 340 and 370 along the sides 302 and 306

Figure 4:
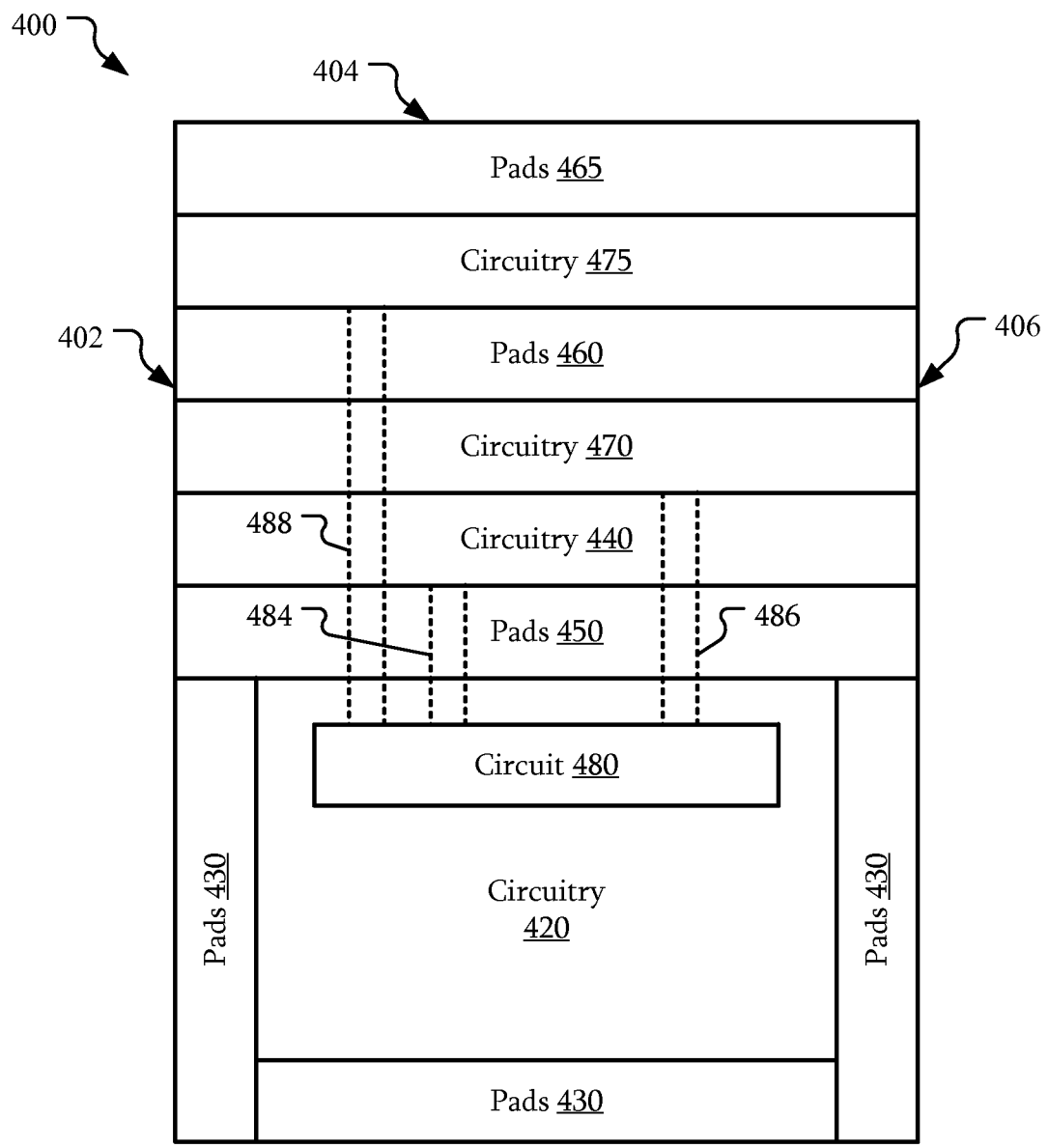
FIG. 4 is a schematic view of an integrated circuit according to another embodiment.

FIG. 4 is a schematic view of an integrated circuit according to another embodiment. In this embodiment the integrated circuit 400 includes circuitry 420, pads 430, circuitry 440, pads 450, pads 460, circuitry 470, circuitry 480, and channels 484 and 486 similar to the circuitry 320, pads 330, circuitry 340, pads 350, pads 360, circuitry 370, circuitry 380, and channels 384 and 386 of the integrated circuit 300 of FIG. 3. However, the integrated circuit 400 also includes additional pads 465 and circuitry 475. Here, the pads 465 are the pads on the perimeter of the substrate and extend from side 402 to 406. Pads 450 and 460 both extend through the interior of the substrate from side 402 to side 406. Pads 465 are operationally coupled to the circuitry 475.

In an embodiment, the pads 465 extend in a first direction along side 404. The pads 460 also extend along the first direction; however, the pads 460 are offset from the first pads 465 in a second direction along side 402 or 406. Similarly, pads 450 extend along the first direction and are offset from both the pads 460 and 465 in the second direction.

The circuitry 475 is coupled to the circuitry 480. In particular, the circuitry 475 is operationally coupled to the circuitry 480 through channel 488. Channel 488 extends through pads 460 and pads 450.

Although three sets of pads 450, 460, and 465 and the respective circuitry 440, 470, and 475 have been described above and two sets with respect to FIG. 3, any number greater than one of sets of circuitry and pads may be present. In a particular embodiment, circuitry associated with one of the pads may be disposed between each of the pads; however, in other embodiments, some sets of pads may be disposed adjacent to each other. For example, locations of pads 460 and circuitry 470 may be switched along with locations of pads 450 and circuitry 440. As a result, pads 450 and 460 may be substantially adjacent to each other.

Figure 5:
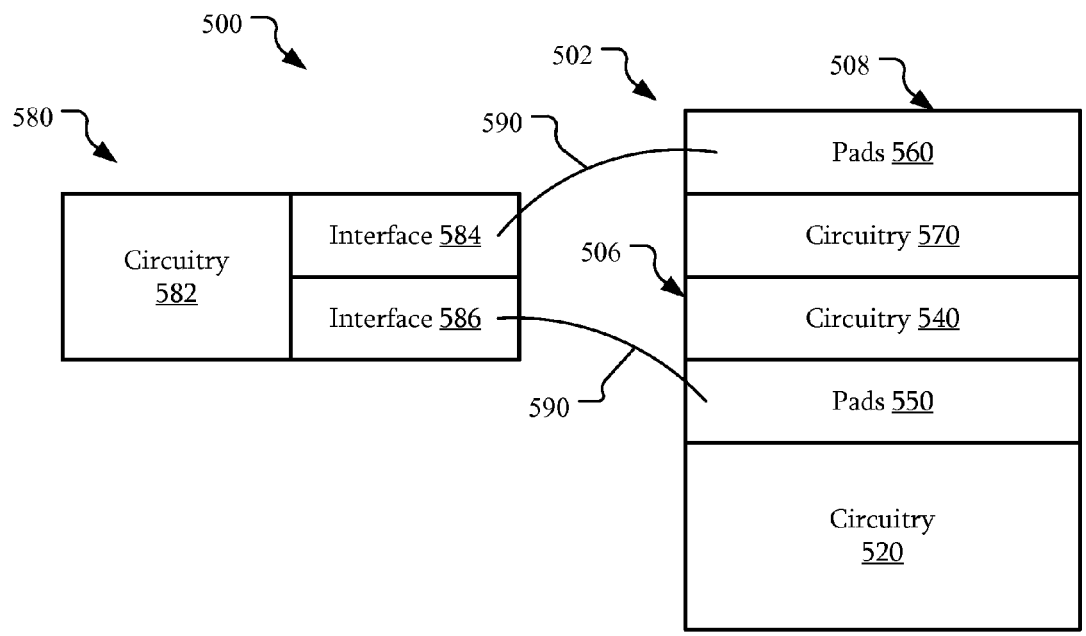
FIG. 5 is a schematic view of an exemplary system according to an embodiment.

FIG. 5 is a schematic view of an exemplary system according to an embodiment. In this embodiment, the system 500 includes integrated circuits 502 and 580. The integrated circuit 502 includes circuitry 520, circuitry 540, circuitry 570, pads 550, and pads 560 similar to circuitry 320, circuitry 340, circuitry 370, pads 350, and pads 360 of FIG. 3. However, elements similar to the channels 384 and 386 and pads 330 are not illustrated for clarity, but may be present.

The integrated circuit 580 includes circuitry 582 and interfaces 584 and 586. The interfaces 584 and 586 may be configured to expose operational access to the circuitry 582. For example, the interfaces 584 and 586 may include pads, bumps, or other interconnections, I/O circuits, or the like.

The interfaces 584 and 586 are coupled to the pads 560 and 550, respectively. In this example, the interfaces 584 and 586 are coupled to the pads 560 and 550 through interconnections 590. The interconnections 590 may be bond wires, circuit board traces, or other interconnections capable of coupling two integrated circuits.

In this embodiment, the integrated circuit 580 is disposed adjacent side 506 of the integrated circuit 502. The connections from pads 550 need not cross over the connections from pads 560 when establishing connections between the integrated circuits 502 and 580. Accordingly, crosstalk or other interference in signals between the pads 560 and the interface 584 due to the signals between pads 550 and interface 586 may be reduced. If the pads 550 were disposed on the same side 508 of the integrated circuit 502, interconnections from the pads 550 may cross interconnections from the pads 560.

Figure 6:
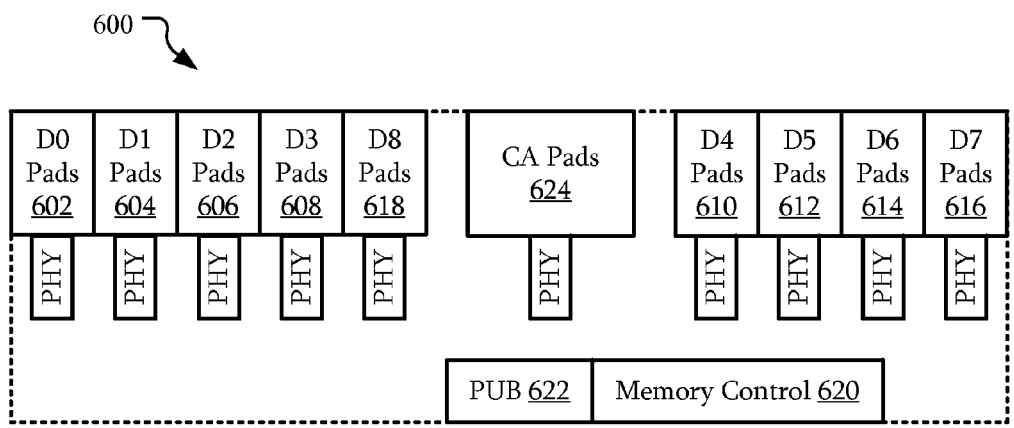
FIG. 6 is a schematic view of a part of an integrated circuit according to another embodiment.

FIG. 6 is a schematic view of a part of an integrated circuit according to another embodiment. In this embodiment, the part 600 includes data pads 602, 604, 606, 608, 610, 612, 614, 616, and 618, and command/address pads 624. Each set of data pads 602, 604, 606, 608, 610, 612, 614, 616, and 618, and command/address pads 624 are associated with physical (PHY) interface circuitry. The PHY interface may include buffers, input/output circuits, skew control circuits, or the like for each of the data pads 602, 604, 606, 608, 610, 612, 614, 616, and 618, and command/address pads 624. PHY Utility Block (PUB) 622 may be configured to control the PHY interface, for example, by controlling timing, skew, or parameters of the PHY of the data pads 602, 604, 606, 608, 610, 612, 614, 616, and 618, and command/address pads 624.

The memory control 620 is configured to control access to a memory device through the data pads 602, 604, 606, 608, 610, 612, 614, 616, and 618, command/address pads 624.

Figure 7:
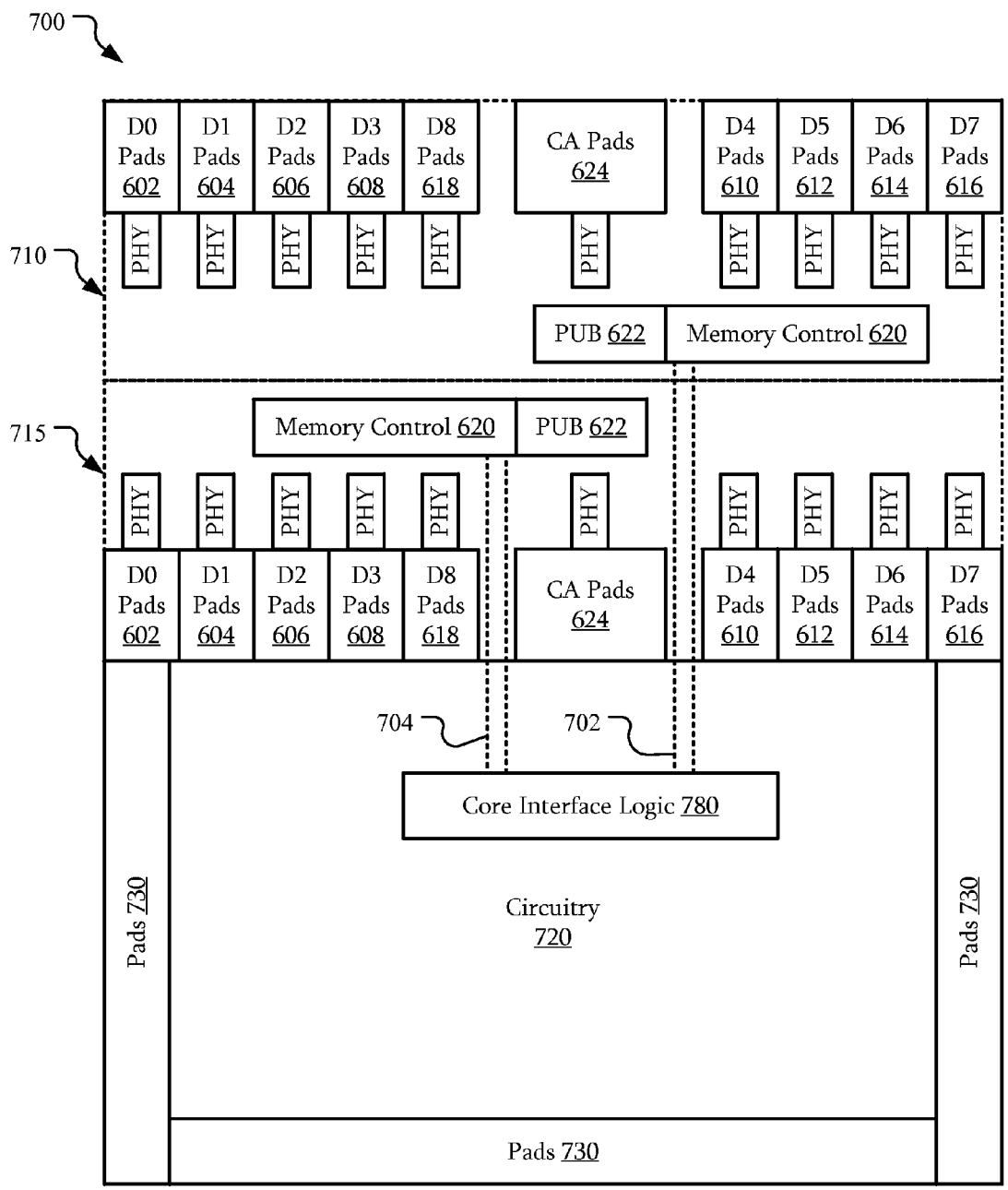
FIG. 7 is a schematic view of a part of an integrated circuit according to another embodiment.

FIG. 7 is a schematic view of an integrated circuit according to another embodiment. In this embodiment, the integrated circuit 700 includes two parts 710 and 715. The parts 710 and 715 are similar to the part 600 of FIG. 6. However, part 715 has a different orientation of elements than part 710. For example, the data pads 602, 604, 606, 608, 610, 612, 614, 616, and 618, and command/address pads 624 are disposed on a different side of the part 715. In addition, the location of the memory control 620 and PUB 622 may also be different. The integrated circuit 700 also includes circuitry 720 and pads 730. The circuitry 720 includes core interface logic 780. The core interface logic 780 is configured to control the interface of other components of the circuitry 720 to a memory device through the parts 710 and 715, such as controlling the transmission of data between the circuitry 720 and a memory device coupled to the parts 710 and 715. In particular, the core interface logic 780 may be configured to communicate control signals with the memory control 620 to send and receive data to and from the memory device through the parts 710 and 715. In addition, the core interface logic 780 may be configured to route such data to other parts of the circuitry 720, such as to processor cores, other internal circuitry, other interface circuitry to interface with external devices through the pads 730, or the like. Although not illustrated, some circuitry may be shared between the parts 710 and 715. For example, phase locked loop (PLL) circuitry, clock distribution circuitry, or the like may be shared between the parts 710 and 715.

Channel 702 extends from memory control 620 to core interface logic 780. In this embodiment, the channel 702 is disposed between the data pads 610 and the CA pads 624. The channel 704 is disposed between the data pads 618 and the CA pads 624. Although in this embodiment, the channels 702 and 704 are disposed to pass between different sets of pads, in other embodiments, multiple channels may be disposed to pass between the same set of pads. For example, the channels 702 and 704 may both be disposed to pass between the data pads 610 and the CA pads 624. Furthermore, although the channels 702 and 704 have been described as passing between a particular set of data pads and the CA pads 624, one or more of the channels 702 and 704 may be disposed to pass between other groups of pads. For example, the channel 704 may be disposed to pass between data pads 608 and data pads 618.

In an embodiment, the integrated circuit 700 may include a stacked double data rate (DDR) multi-channel padring design as part of a system on a chip (SOC) integrated circuit. DDR channels, including parts 710 and 715, are separated from SOC core interface logic 780. PHY Utility Blocks (PUB) 622 are placed in the parts 710 and 715. As described herein the placement of the PHY and PUB 622 may improve the I/O and power integrity of each DDR channel. For clarity, DDR channel will be used to refer to a channel associated with a DDR memory device in contrast to channels 702 and 704. In a particular embodiment, the data pads, PHY blocks, PUB 622 and memory control 620 associated with each DDR channel are broken out from the remainder of the integrated circuit 700. Accordingly, custom buffering, skew control, or the like may be controlled substantially local to the pads of the respective DDR channel.

Although the integrated circuit 700 is illustrated as a rectangle, the integrated circuit 700 may be substantially a square shape. A substantially square shape may allow more integrated circuits to be placed on a single, circular wafer. When a reduced number of inputs and outputs are present in an integrated circuit 700, achieving a substantially square shape may be easier. In contrast, as the number of inputs and outputs increase, the difficulty of achieving a substantially square shape may increase. However, in a particular embodiment, a difficulty of designing an integrated circuit may be reduced, a relative size may be reduced, or the like by using an integrated circuit designed as described herein.

For example, for higher speed, wider bandwidth DDR3/DDR4 designs, at least 72 bit data, and 8 bit ECC control, and command/address I/Os may total over 160 I/Os for a single DDR channel. For integrated circuits designed for higher speeds, more power may be consumed by the system. Accordingly, a particular Signal:Power:Ground ratio may be maintained to reduce noise. For DDR operating over about 1600 MHz, a 2:1:1 ratio may be used, i.e. for every two signal pads, one power and one ground pad are used. As a result, the total pads for a DDR channel will be doubled to over about 320 considering both signal and power/ground pads. Although only data and CA pads are illustrated, power and ground pads may also be disposed within parts 710 and 715. As described above, a number of parts 710 and 715 greater than the two described herein may be used; however, two DDR channels will be used as an example.

In an embodiment, a length of a side of the integrated circuit 700 may be reduced using integrated circuits described herein than if the pads of both parts 710 and 715 are placed along one side of the integrated circuit 700. For example, with over 300 pads for each channel and a single pad width of about 35 µm, the resulting length of a single DDR channel's pads are at least about 300×35 µm=10500 um or about 10.5 mm. With two DDR channels, the width may have a minimum of about 22.4 mm for the DDR channel pads alone. The circuitry 720 may include other interfaces, general purpose inputs/outputs, or the like, such as those for SATA, PCIe, Sgmii, Xaui, or the like.

In this embodiment, the part 710 may implement the interface for DDR channel 0 and part 715 may implement the interface for DDR channel 1. Accordingly, the DDR channel 0 pads are placed a side of the integrated circuit 700, while DDR channel 1 pads are placed within the integrated circuit, i.e. extending into an interior of the integrated circuit. Between the pads of parts 710 and 715 are PHY for each byte of the DDR channel, i.e. byte D0-D8, and the CA pads, and the PUB 622 and memory control 620 for the particular DDR channels. The PHYs are placed substantially adjacent to their associated pads. As a result, skew and timing may be controlled for each byte D0-D8 lane.

The channels 702 and 704 may include buffers to accommodate the data rate of data transmission between the core interface logic 780 and the DDR channels 0 and 1. Skew and latency control may also be implemented by the channels 702 and 704.

In an embodiment, the integrated circuit 700 may result in improved isolation between DDR channels, power delivery, signal integrity, routing length matched stripe-lined breakout, timing, congestion, and chip size. For example, referring to FIGS. 5 and 7, if the interfaces 584 and 586 are DDR channels for a memory device, the data pads D0 602 in both parts 710 and 715 are disposed on substantially the same side. As a result, the interconnections 590 need not cross when connecting to the interfaces 584 and 586.

Furthermore, since the pads for DDR channel 1 in part 715 extend within the integrated circuit 700 and are not disposed on the same side as the pads for DDR channel 0 in part 710, the length of that side may be reduced relative to a design with the pads of both DDR channels 0 and 1 along a single side of the integrated circuit 700. As a result, a substantially square shape of the integrated circuit 700 may be more easily achieved.

Figure 8:
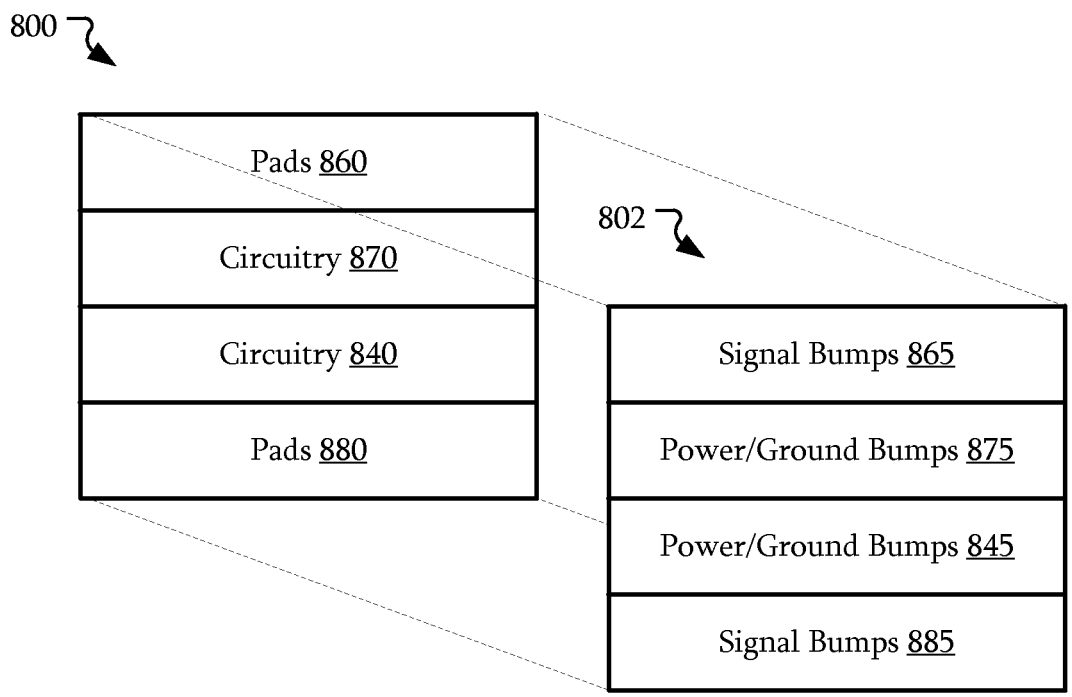
FIG. 8 is a schematic view of a relationship of pads to bumps in an integrated circuit according to an embodiment.

FIG. 8 is a schematic view of a relationship of pads to bumps in an integrated circuit according to an embodiment. In this embodiment, an integrated circuit 800 includes pads 860 and 880 and circuitry 840 and 870 similar to other integrated circuits described herein. Additional circuitry and pads of the integrated circuit 800 are not illustrated for clarity, but may be present.

Bumps 802 include signal bumps 865 and 885 and power/ground bumps 845 and 875. The bumps 802 are illustrated as offset from the integrated circuit 800; however, the bumps 802 are disposed over integrated circuit 800 and are merely illustrated as being offset for clarity. Accordingly, the signal bumps 865 may be disposed over the pads 860, the signal bumps 885 may be disposed over the pads 880, the power/ground bumps 845 are disposed over the circuitry 840, and the power/ground bumps 875 are disposed over the circuitry 870. Accordingly, a routing of connections between the bumps 802 and underlying structures, such as through a redistribution layer (RDL), may be simplified.

In a particular embodiment, the location of the pads 860 and 880 and the corresponding signal bumps 865 and 885 may improve signal integrity between the pads and the bumps and ease routing to other integrated circuits. For example, RDL routing for power, signal integrity of a high speed interface for DDR3/4 signals may be improved to meet or exceed performance specifications such as those of the Joint Electron Device Engineering Council (JEDEC). Furthermore, the placement of power/ground bumps 845 and 875 over the circuitry 840 and 870 may improve power delivery to the circuitry 840 and 870, and/or power/ground pads of the pads 860 and 880. Moreover, the signal bumps 865 and 885 are offset from each other, which may further improve signal integrity.

As described above, a ratio of signal to power to ground pads may be 2:1:1. Accordingly, there may be equal number of signal pads and power/ground pads. For DDR channel 0, the signal bumps 865 may be outer 4 rows of the bumps 802. The associated power and ground bumps may be the next rows of bumps in the power/ground bumps 875. The DDR channel 1 data and power/ground bumps 885 and 845 may be the mirror of the DDR channel 0 bumps 865 and 875. That is, the power/ground bumps 845 may be coupled to power/ground pads of the pads 880 and the signal bumps 885 may be coupled to signal pads of the pads 880.

As a result, the signal bumps 865 and 885 have two sets of rows of power/ground bumps 845 and 875 in between them. This placement may provide improved separation between two DDR channels for improved signal integrity. That is, the power/ground bumps 845 and 875 between the two DDR channel signal bumps 865 and 885 may improve separation and shielding for the DDR signals.

In addition, the integrated circuit 800 may provide an improved breakout for a packaged device. Using two channel DDRs as an example, the package bumps may be sorted by the byte. There may be 8 DQ bytes and one ECC byte segment for each channel. In order to match a Dual Inline Memory Module (DIMM) specified by JEDEC, the byte slices may be arranged in an order of bytes 0, 1, 2, 3, and 8, CA bumps, and bytes 4, 5, 6, 7 for both DDR channels. This arrangement results in easier placement and routing for a package to connect to the bumps since the bumps are located on the relatively same side for the same byte lane on different channels. With such a stripe line breakout, the ground planes may be placed between the layers used for signal routing for each channel, and ground plane sharing may be possible between two DDR channels.

In a particular embodiment, the number and size of pads may have an improved relationship to the pads. For example, using a pad width of 35 μm, as described above, the total width would be about 10.5 mm for 300 pads adjacent each other. Using a bump pitch of 164 μm (diagonal) or 232 μm horizontally, there will be about 45 (10500 μm/232) bumps in each row with a chip width of 10.5 mm. About 3.6 rows of bumps will be allocated for 162 signal pads of each DDR channel.

Another embodiment includes a method of forming an integrated circuit as described herein. For example, an integrated circuit may be formed having the structures, layouts, circuits, relative orientations, or the like as described above. In a particular example, the method may be implemented in an automatic place and route system used to design the integrated circuit.

Figure 9:
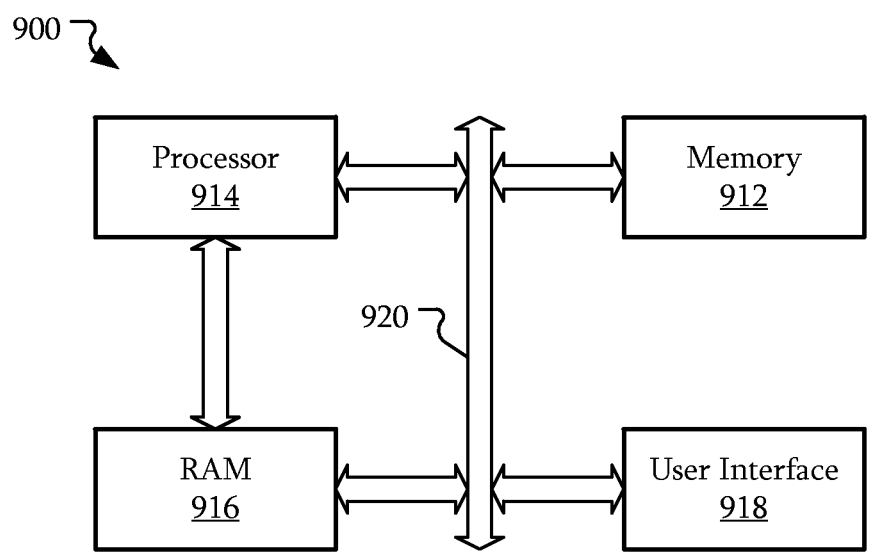
FIG. 9 is a schematic view of an electronic system which may include an integrated circuit according to an embodiment

FIG. 9 is a schematic view of an electronic system which may include an integrated circuit according to an embodiment. The electronic system 900 may be part of a wide variety of electronic devices including, but not limited to portable notebook computers, Ultra-Mobile PCs (UMPC), Tablet PCs, servers, workstations, mobile telecommunication devices, and so on. For example, the electronic system 900 may include a memory system 912, a processor 914, RAM 916, and a user interface 918, which may execute data communication using a bus 920.

The processor 914 may be a microprocessor or a mobile processor (AP). The processor 914 may have a processor core (not illustrated) that can include a floating point unit (FPU), an arithmetic logic unit (ALU), a graphics processing unit (GPU), and a digital signal processing core (DSP Core), or any combinations thereof. The processor 914 may execute the program and control the electronic system 900. The processor 914 may be configured to perform some or all of the operations of the various controllers described above.

The RAM 916 may be used as an operation memory of the processor 914. Alternatively, the processor 914 and the RAM 916 may be packaged in a single package body. In particular, the processor 914 and RAM 916 may be coupled an implemented as a SOC as described herein. Although a combination of the processor 914 and RAM 916 has been used as an example, other integrated circuits, including other integrated circuits coupled together, may include pads disposed as described above.

The user interface 918 may be used in inputting/outputting data to/from the electronic system 900. The memory system 912 may store codes for operating the processor 914, data processed by the processor 914, or externally input data. The memory system 912 may include a controller and a memory. The memory system may include an interface to computer readable media. Such computer readable media may store instructions to perform the variety of operations describe above.

Although the structures, methods, and systems have been described in accordance with exemplary embodiments, one of ordinary skill in the art will readily recognize that many variations to the disclosed embodiments are possible, and any variations should therefore be considered to be within the spirit and scope of the apparatus, method, and system disclosed herein. Accordingly, many modifications may be made by one of ordinary skill in the art without departing from the spirit and scope of the appended claims.

The invention claimed is:

1. An integrated circuit, comprising:
   a substrate;
   a first circuit formed on the substrate and coupled to a plurality of first pads on the substrate; and
   a second circuit formed on the substrate and coupled to a plurality of second pads on the substrate;
   wherein:
     the first pads are formed on a perimeter of the substrate;
     the second pads extend from the perimeter of the substrate towards an interior of the substrate; and
     each of the first circuit and the second circuit comprises:
       a plurality of input/output interfaces; and
       memory control logic;
   a third circuit; and
   a channel extending through the second pads;
   wherein the first circuit and the second circuit are operationally coupled through the channel.

2. The integrated circuit of claim 1, wherein:
   the first pads extend in a first direction;
   the second pads extend in the first direction;
   the second pads are offset from the first pads in a second direction; and
   the first direction and second direction are substantially perpendicular.

3. The integrated circuit of claim 1, wherein:
   the second pads include:
     a first group of data pads;
     a second group of control pads; and
     a third group of data pads; and
   the channel extends between the second group and at least one of the first group and the third group.

4. The integrated circuit of claim 1, wherein the first circuit and the third circuit are configured to communicate data through the channel.

5. The integrated circuit of claim 1, wherein the first circuit and the second circuit are disposed between the first pads and the second pads.

6. The integrated circuit of claim 1, further comprising:
   a plurality of first bumps;
   a plurality of second bumps; and
   a plurality of power and ground bumps;
   wherein:
     the first pads are coupled to the first bumps;
     the second pads are coupled to the second bumps; and
     the power and ground bumps are disposed between the first bumps and the second bumps.

7. The integrated circuit of claim 1, wherein:
   the first pads are disposed along a first side of the substrate and extend from a second side of the substrate to a third side of the substrate;
   the second pads extend from the second side to the third side; and
   the first side is substantially perpendicular to the second side and the third side.

8. A system, comprising:
   an first integrated circuit comprising:
     a substrate;
     a first circuit formed on the substrate and coupled to a plurality of first pads on the substrate; and
     a second circuit formed on the substrate and coupled to a plurality of second pads on the substrate;
     wherein:
       the first pads are formed on a perimeter of the substrate; and
       the second pads extend from the perimeter of the substrate towards an interior of the substrate; and
   a second integrated circuit coupled to at least part of the first pads and at least part of the second pads;
   wherein the second integrated circuit is a memory device.

9. A method, comprising:
   forming a first circuit and a second circuit on a substrate;
   forming a plurality of first pads on the substrate, coupled to the first circuit and disposed on a perimeter of the substrate; and
   forming a plurality of second pads on the substrate, coupled to the second circuit, and extending from the perimeter of the substrate towards an interior of the substrate;
   wherein forming each of the first circuit and the second circuit comprises:
     forming a plurality of input/output interfaces; and
     forming memory control logic;
   forming a plurality of first bumps coupled to the first pads;
   forming a plurality of second bumps coupled to the second pads; and
   forming a plurality of power and ground bumps between the first bumps and the second bumps.

10. The method of claim 9, wherein:
   forming the first pads comprises forming the first pads extending in a first direction;
   forming the second pads comprises forming the second pads extending in the first direction and offset from the first pads in a second direction; and
   the first direction and second direction are substantially perpendicular.

11. The method of claim 9, further comprising:
   forming a third circuit on the substrate; and
   forming a channel extending through the second pads;
   wherein the first circuit and the second circuit are operationally coupled through the channel.

12. The method of claim 11, wherein:
  forming the second pads comprises:
    forming a first group of data pads;
    forming a second group of control pads; and
    forming a third group of data pads; and
  forming the channel comprises forming the channel extending between the second group and at least one of the first group and the third group.

13. The method of claim 11, wherein the first circuit and the third circuit are configured to communicate data through the channel.

14. The method of claim 9, wherein forming the first circuit and forming the second circuit comprises forming the first circuit and the second circuit between the first pads and the second pads.

15. The method of claim 9, wherein:
  forming the first pads comprises forming the first pads along a first side of the substrate and extending from a second side of the substrate to a third side of the substrate;
  forming the second pads comprises forming the second pads extending from the second side to the third side; and
  the first side is substantially perpendicular to the second side and the third side.

* * * * *